(12) United States Patent
Garg et al.

(10) Patent No.: US 7,810,056 B1
(45) Date of Patent: Oct. 5, 2010

(54) METHOD AND SYSTEM FOR IMPLEMENTING CONTEXT AWARE SYNTHESIS OF ASSERTIONS

(75) Inventors: Tarun Garg, Rohini (IN); Vinaya Kumar Singh, Noida (IN)

(73) Assignee: Cadence Design Systems, Inc., San Jose, CA (US)

( * ) Notice: Subject to any disclaimer, the term of this patent is extended or adjusted under 35 U.S.C. 154(b) by 843 days.

(21) Appl. No.: 11/711,950

(22) Filed: Feb. 27, 2007

(51) Int. Cl.
*G06F 17/50* (2006.01)
(52) U.S. Cl. .................................... 716/3; 716/4; 716/5
(58) Field of Classification Search .................. 716/1–5, 716/16–18
See application file for complete search history.

(56) References Cited

U.S. PATENT DOCUMENTS

| | | | |
|---|---|---|---|
| 5,987,239 A | | 11/1999 | Kirsch |
| 6,591,403 B1 | | 7/2003 | Bass et al. |
| 6,651,228 B1 | * | 11/2003 | Narain et al. ................... 716/5 |
| 6,742,166 B2 | | 5/2004 | Foster et al. |
| 7,188,324 B1 | | 3/2007 | Qiu et al. |
| 7,313,772 B2 | | 12/2007 | Hekmatpour et al. |
| 7,325,209 B2 | | 1/2008 | Mitra et al. |
| 7,340,700 B2 | | 3/2008 | Emerson et al. |
| 7,386,813 B2 | | 6/2008 | Singh et al. |
| 7,421,668 B1 | | 9/2008 | Ip et al. |
| 7,454,324 B1 | | 11/2008 | Seawright et al. |
| 7,596,770 B1 | * | 9/2009 | Kuehlmann et al. ............. 716/3 |
| 7,603,636 B2 | | 10/2009 | Yamada |
| 2003/0018945 A1 | | 1/2003 | Foster et al. |
| 2006/0271890 A1 | | 11/2006 | Hekmatpour et al. |
| 2006/0271904 A1 | | 11/2006 | Emerson et al. |
| 2007/0074137 A1 | | 3/2007 | Nishida et al. |
| 2008/0015838 A1 | * | 1/2008 | Stern ........................... 703/15 |
| 2008/0066030 A1 | | 3/2008 | Hekmatpour et al. |
| 2008/0072196 A1 | | 3/2008 | Hekmatpour et al. |
| 2008/0104556 A1 | | 5/2008 | Yamada |
| 2009/0144680 A1 | | 6/2009 | Lehavot et al. |

FOREIGN PATENT DOCUMENTS

| | | |
|---|---|---|
| JP | 2006285626 | 10/2006 |
| WO | 2006035854 | 4/2006 |

OTHER PUBLICATIONS

Accellera "Property Specification Language Reference Manual Version 1.1", Jun. 2004, pp. 1-131, located at http://www.eda.org/vfv/docs/PSL-v1.1.pdf.

Accellera "SystemVerilog 3.1a Language Reference Manual," Accellera's Extensions to Verlog, May 2004, pp. 1-568 located at http://www.eda.org/sv/SystemVerilog_3.1a.pdf.

(Continued)

*Primary Examiner*—Paul Dinh
(74) *Attorney, Agent, or Firm*—Vista IP Law Group LLP

(57) ABSTRACT

A method and system for implementing context aware synthesis of assertions is disclosed. The method and system for assertion synthesis includes converting an assertion formula to sequence implication form using semantic preserving rewrite rules, performing optimizations on the resulting formula to reduce the number of state-bits in a final FSM (Finite State Machine), and synthesizing the resulting formula to the final FSM using context aware sequence synthesis.

24 Claims, 4 Drawing Sheets

OTHER PUBLICATIONS

Barrione et al., "On-line Asertion-Based Verification with Proven Correct Monitors", ITI 3rd International Conference on Information and Communications Technology, Dec. 5-6, 2005, pp. 125-143.

Beer, I et al. "On-the-fly model checking of RCTL formulas" 10th International Conference on Computer Aided Verification (CAV '98), 1998, pp. 1-12, located at http://www.research.ibm.com/haifa/projects/verification/RB_Homepage/ps/ag-bool_f.ps.

Beer et al., "The Temporal Logic Sugar", 13th Conference on Computer-Aided Verification, Jul. 2001, pp. 363-367.

Ben-David, S. et al. "Automata construction for regular expressions in model checking" pp. 1-12, located at http://www.wisdom.weizmann.ac.il/{dana/publicat/pos-nfa.pdf.

Datta, K. et al. "Assertion based verfication using HDVL" Proceedings of the 17th International Conference on VLSI Design, Mumbai, India, Jan. 5-9, 2004, pp. 319-325.

Gawanmeh, A. et al., "Embedding and Verification of PSL Using AsmL", Proceedings of the International Conference on Abstract State Machines (ASM'05), Mar. 2005, pp. 201-216, Paris, France.

Gheorghita, S. V. et al., "Constructing Checkers From PSL Properties", Proceedings of the 15th International Conference on Control Systems and Computer Science May 2, 2005, pp. 757-762, ES [06.11], The Netherlands.

Gordon, M.J.C. "Validating the PSL/sugar semantics automated reasoning" Formal Aspects of Computing, Springer-Verlag, UK, Dec. 2003, vol. 15, No. 4, pp. 406-421.

Habibi et al., "On the Design and Verification Methodology of the Look-Aside Interface", 2005 Proceedings of Design, Automation and Test Confernece in Europe, Mar. 7-11, 2005, vol. 3, pp. 290-295.

Habibi et al., "Towards an Efficient Assertion Based Verification of SystemC Designs", Ninth IEEE International High-Level Design Validation and Test Workshop, Nov. 10-12, 2004.

Habibi et al., "Design for Verification of SystemC Transaction Level Models", Proceedings of Design, Automation and Test in Europe, vol. 1, Mar. 7-11, 2005, pp. 560-565.

Hopcroft, J. et al., "Introduction to Automata Theory, Languages, and Compuatation", 2nd edition.

Kamel et al., "Redundancy: An Approach to the Efficient Implementation of Semantic Integrity Assertions", Proceedings of the 23rd Annual Hawaii International Conference on Systems Sciences, vol. 2, Jan. 2-5, 1990, pp. 393-399.

Maidl, M. "Common fragment of CTL and LTL" Proceedings of the 2000 IEEE Annual Symposium on Foundations of Computer Science, Los Alamitos, CA 2000, pp. 643-652.

Massonet et al., "Analogical Reuse of Requirements Frameworkds," Proceedings fo the Third IEEE International Symposium on Requirements Engineering, Jan. 6-10, 1997, pp. 26-37.

Morin-Allory et al., "Asynchronous Assertion Monitors for Multi-Clock Domain System Verification", Seventeenth IEEE International Workshop on Rapid System Prototyping, Jun. 14-16, 2006, pp. 98-102.

Pacholik, A; et al., "Real Time Constraints in System Level Specifications Improving the Verificatoin Flow of Complex Systems", In: Proceedings of Net.ObjectDays 2005, Sep. 19-22, 2005, pp. 283-294.

Ruah, S. et al. "Automata construction for on-the-fly model checking PSL safety simple subset"pp. 1-22, located at http://www.wisdom.weizmann.ac.il/{dana/publicat/sefety_psl_det.pdf.

Somenzi, F. "Efficient Buchi Automata from LTL Formulae", CAV'00, pp. 248-263, 2000.

Tuerk, T. et al., "From PSL to LTL: A Formal Validation in HOL", Proceedings of the International Conference on Theorem Proving in Higher Order Logics (TPHOL), Aug. 22, 2005, pp. 342-357, Springer-Verlag, Germany.

Supplemental Search Report dated Mar. 1, 2007 for European Applicaton No. 05852297.0.

Non-Final Office Action dated May 29, 2009 for U.S. Appl. No. 11/712,003.

* cited by examiner

METHOD AND SYSTEM FOR IMPLEMENTING CONTEXT AWARE SYNTHESIS OF ASSERTIONS

BACKGROUND

1. Field

The field of the present invention relates to verification technology of digital designs, and in particular, to a method and system for implementing context aware synthesis of assertions.

2. Description of Related Art

Assertion Based Verification (ABV) is widely used in the electronics industry for functional verification. ABV has become a mainstream verification technology of digital designs. IEEE 1850 PSL (Property Specification Language) and IEEE 1800 SVA (System Verilog Assertions) are standard languages for specifying assertions in ABV. In ABV assertions written in PSL or SVA are verified by various verification tools. Assertions describe the behavior of circuits at a high level of abstraction. These need to be synthesized to finite state machines for verification tools to verify them. In addition, these may need to be synthesized to Deterministic Finite Automata (DFA) and Non-deterministic Finite Automata (NFA) for verification tools to use them.

In general, techniques to synthesize PSL and SVA are not readily addressed in literature. The generally known LTL (Linear Time Logic) formula to automata generation for model checking does not apply directly to PSL and SVA assertion synthesis. In PSL and SVA, complexity is added over and above LTL due to the presence of sequences and local-variables. In general, a sequence defines temporal behavior and has constructs over and above regular expressions. This adds requirements on PSL and SVA assertion synthesis.

The performance of formal verification degrades exponentially with increase in size of the Finite State Machines (FSM) corresponding to assertions, and the performance of emulation and simulation degrades with increase in size of FSMs. Thus, assertion synthesis generates FSMs with a least possible number of states.

SUMMARY

IEEE 1850 PSL (Property Specification Language) and IEEE 1800 SVA (System Verilog Assertions) have sequences to specify temporal behavior. Some embodiments of the invention provide techniques of language transformation for PSL and SVA formula into a novel form. In one embodiment, this novel form comprises a nested sequence implication formula. The techniques for synthesis of sequences are discussed herein. Sequences may be synthesized to non-deterministic or deterministic finite state machines of size ranging from O(n) states to $O(2^{2^n})$ states, where n comprises the length of the sequence.

A systematic approach in deciding which implementation to choose depends upon the context of a sequence in an assertion. In one aspect, classes of rule based optimizations for assertions formulas are provided. An assertion may be synthesized in less number of state-bits as compared to conventional implementations. In another aspect, sequence synthesis is sufficient to support synthesis of PSL and SVA, wherein PSL for a simulatable subset of PSL is provided as a simple subset definition.

Formal Verification should exploit non-deterministic FSM (Finite State Machine) wherever possible to reduce the size of the FSM which in turn may improve the verification performance. Assertion synthesis in verification flows is offered by Cadence that support ABV (Assertion Based Verification) namely Formal Verification, Emulation, Post-processing of simulation trace, Hybrid Verification, HDL and System C Simulation, etc.

Embodiments of the invention provide for a method and system that implements context aware synthesis including converting an assertion formula to nested sequence implication form using semantics preserving rewrite rules, synthesizing the resulting formula to a state machine using sequence synthesis, and optimizing the resulting state machine to reduce a number of states in the state machine.

Embodiments of the invention provide for a method and system for assertion synthesis including converting an assertion formula to sequence implication form using semantic preserving rewrite rules, optimizing the resulting formula to reduce a number of states in a state machine, and synthesizing the resulting formula to the state machine using context aware sequence synthesis.

Embodiments of the invention provide for a method and system for assertion synthesis of circuitry including converting an assertion formula to sequence implication form using semantic preserving rewrite rules, optimizing the resulting formula to reduce a number of states in a state machine, synthesizing the resulting formula to the state machine using context aware sequence synthesis, and verifying the circuitry using the state machine.

Embodiments of the invention provide for a method and system for assertion synthesis that is applicable to at least one form of Assertion Based Verification (ABV) including at least one of formal verification, simulation and emulation.

These and other objects and advantages of the present teachings will become more fully apparent from the following description taken in conjunction with the accompanying drawings.

DETAILED DESCRIPTION

Figure 1:
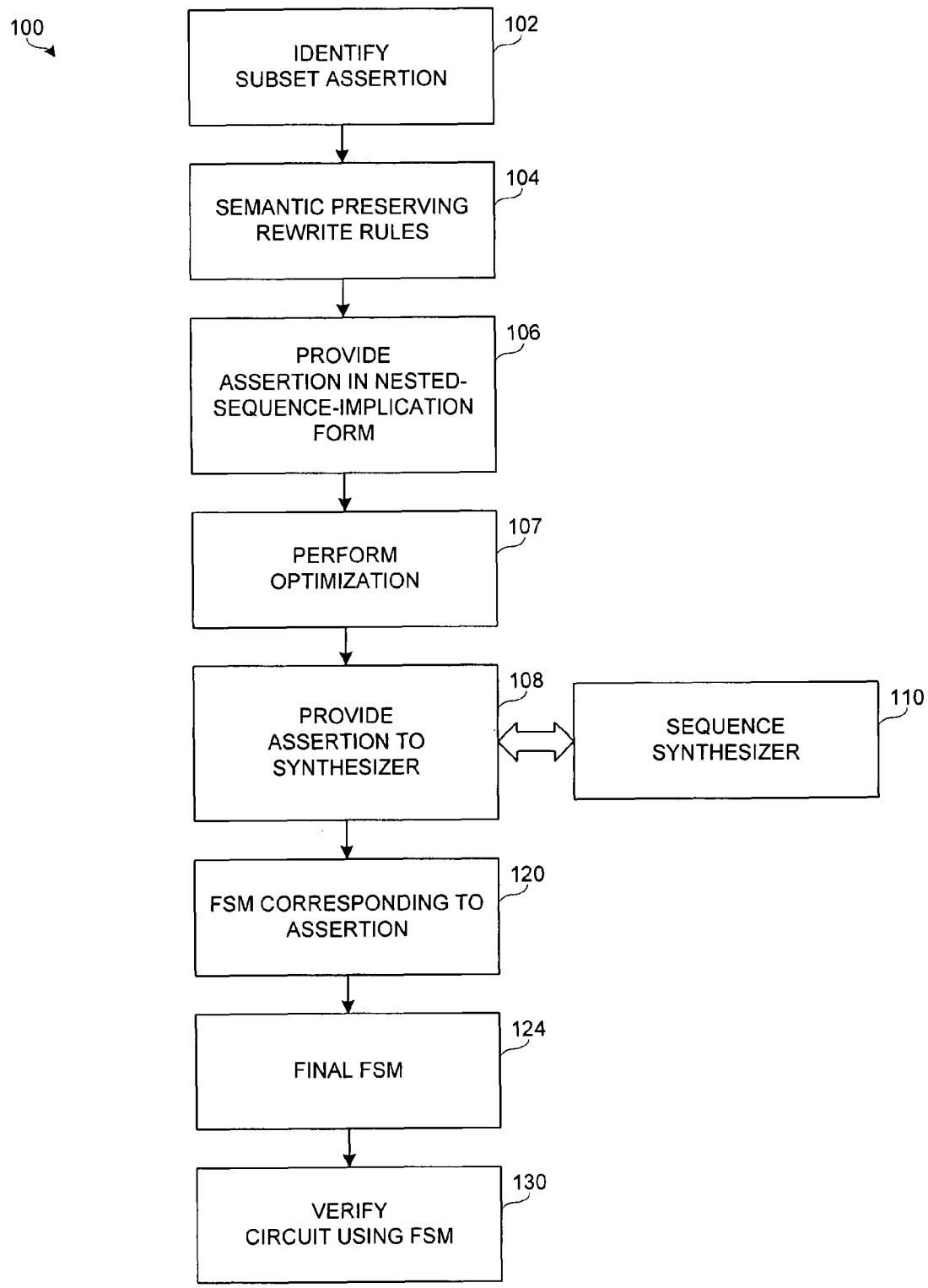
FIG. 1 shows one embodiment of an assertion synthesis method.

Various embodiments of the present invention are described hereinafter with reference to the drawings. It should be noted that the drawings are not drawn to scale and that elements of similar structures or functions are represented by like reference numerals throughout the drawings.

FIG. 1 shows one embodiment of a method for assertion synthesis 100 including conversion of IEEE 1850 PSL (Property Specification Language) and IEEE 1800 SVA (System Verilog Assertions) formula to sequence implication form using semantics preserving rewrite rules, doing opportunistic optimizations on the resulting formula, synthesis of this resulting formula to FSM (Finite State Machines) using context aware sequence synthesis.

In one embodiment; as shown in FIG. 1, action 102 of the method 100 includes identifying a PSL and SVA simple subset assertion. In one aspect, the simple subset of PSL comprises a subset that conforms to a notion of monotonic advancement of time, such as left to right through the property, which provides that properties within the subset may be simulated. The term "property" may be referred to as a collection of logical and temporal relationships between Boolean expressions, sequential expressions, and other properties. The term "sequential expression" may be referred to as a finite series of terms that represent a set of behaviors over multiple evaluation cycles.

In 104 of method 100 of FIG. 1, semantic preserving rewrite rules are applied to the PSL/SVA formula. In one embodiment, a formula is made up of Boolean, sequence, sequence implication and LTL operators on Boolean, sequence and sequence implication. For simple subset of PSL, LTL operators may be transformed into a sequence implication formula though semantic preserving rewrite rules. In general, conventional transformation techniques do not address aborts and nested formula in totality. In contrast, embodiments of method 100 provides revised rules to overcome limitations of conventional techniques. In one aspect, proof may be established by showing equivalence of FSMs for LHS (left-hand-side) and RHS (right-hand-side) of the rules. Additional information in reference to rewrite rules may be found in co-pending patent application Ser. No. 11/001,327 (U.S. Pub. No. 2006/0136879) entitled, "TRANSFORMATION OF SIMPLE SUBSET OF PSL INTO SERE IMPLICATION FORMULAS FOR VERIFICATION WITH MODEL CHECKING AND SIMULATION ENGINES USING SEMANTIC PRESERVING REWRITE RULES", filed Nov. 30, 2004, which is incorporated herein by reference in its entirety.

In 106 of method 100 of FIG. 1, formula in PSL and SVA are converted into semantically equivalent nested sequence implication form. This creates a unified representation for arbitrary formula. In one aspect, rewrite rules convert any formula in simple subset of PSL and SVA to a set of nested sequence implication form.

In one embodiment, the following rules show transformation of basic LTL operators i.e. 'X' (next), 'U' (strong until) and 'W' (weak until) on sequence implication to a set of nested sequence implication forms. The syntax comprises PSL, and other LTL operators may be written in terms of basic LTL operators. In one aspect, any PSL and SVA formula may be converted to sequence implication form.

Rule 1: (b)↔({T}|—>{b})

Rule 2: ({r1})↔({T}|—>{r1})

Rule 3: (X({r1}|—>{r2}[!]))↔({T[*2]}|—>({r1}|—>{r2}[!]))

Rule 4: (({r1}|—>{r2}[!])W c)↔({!c[+]}|—>({r1}|—>{r2}[!]))

Rule 5: (({S1}|—>{S2}[!])U c)↔({T}|—>{T[*];c}!, ({!c[+]}|—>({S1}|—>{S2}[!])))

For example, Rule 5 converts a formula into a set of formula. In one embodiment, the first formula on RHS of Rule 5 asserts that the c should be true sometime in the future, and the second formula asserts that that till c is false, the formula S1|—>S2 should hold. In one aspect, a clocked formula may be converted to a semantically equivalent unclocked formula. A top level clock may be assumed on the assertion. There may be PSL abort (or SVA discharge) at any sequence-implication level. The abort has reset semantics. Aborts are handled as discharge of the generated FSM, as will be described. After application of these rules, each PSL and SVA formula is transformed to sequence implication form with or without aborts on sub-formula.

In 107 of method 100 of FIG. 1, optimization of the sequence implication form is performed. In 108, one or more assertions are provided to a sequence synthesizer 110 for synthesizing sequences to non-deterministic and deterministic FSMs. In 120, an FSM corresponding to the one or more assertions is provided. In 124, a final FSM is provided. In 130, circuitry and/or design thereof can be verified using the final FSM provided in action 124. Further discussion and explanation of the method 100 and actions thereof will be described in greater detail herein.

In one embodiment, during sequence synthesis, conversion of a regular expression to non-deterministic and deterministic FSMs (Deterministic Finite Automata (DFA) and Non-deterministic Finite Automata (NFA)) may be achieved. In one aspect, PSL and SVA sequences have constructs over and above regular expression. These constructs and their handling for synthesis is discussed herein.

In one embodiment, fusion of two sequences (R1:R2) may be synthesized to an FSM. The algorithm, in one example, for FSM creation for fusion (R1:R2) is shown in FIGS. 4A, 4B, 5.

Figures 4A, 4B:
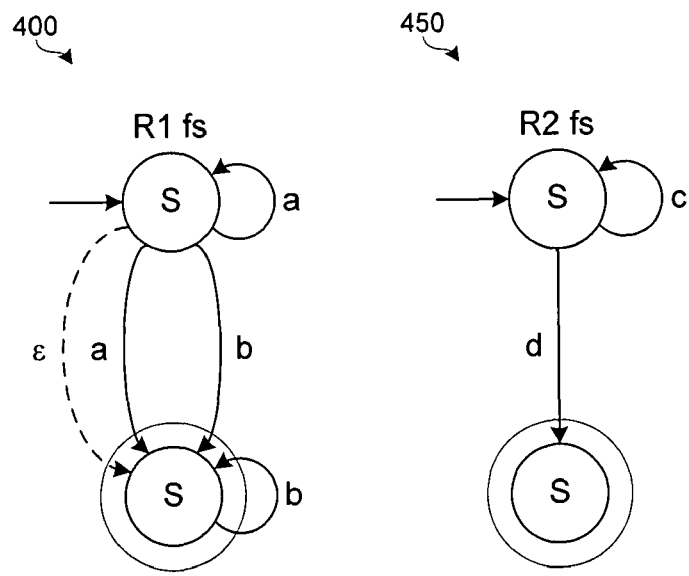
FIG. 4A shows one embodiment of FSM for R1={a[*];b[*]}.
FIG. 4B shows one embodiment of FSM for R2=[c[*];d}.
Figure 5:
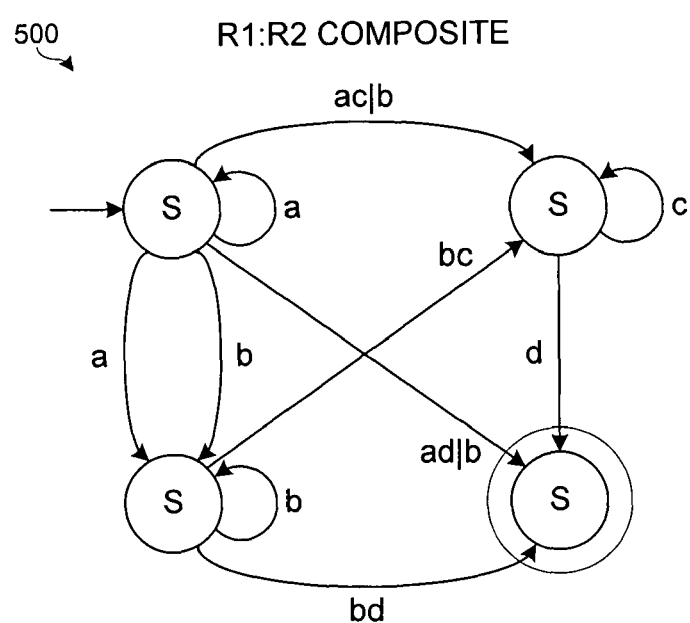
FIG. 5 shows one embodiment of a composite FSM for R1 and R2.

FIG. 4A shows one embodiment of FSM 400 for R1={a[*];b[*]}, FIG. 4B shows one embodiment of FSM 450 for R2=[c[*];d}, and FIG. 5 shows one embodiment of a composite FSM 500 for R1 and R2. In one aspect, since FSM may be converted to a regular expression, fusion may be converted to a regular expression.

In one embodiment, (R1:R2) holds tightly on a path iff there is a future cycle n, such that R1 holds tightly on the path up to and including the n cycle and R2 holds tightly on the path starting at the n cycle. The term "holds" may referred to as the meaning of a Boolean expression, sequential expression, or property. In one aspect, a Boolean expression, sequential expression, or property holds at a first cycle of a path iff, wherein the path exhibits the behavior described by the Boolean expression, sequential expression, or property. The term "holds tightly" may be referred to as the meaning of a sequential expression, wherein sequential expressions are evaluated over finite paths (behavior). In one aspect, a sequential expression holds tightly along a finite path iff when the path exhibits the behavior described by the sequential expression.

Sequence Suffix implication(|—>):[1]

A Sequence|—>FL Property holds in a given cycle of a given path iff:

1) The Sequence that is the left operand does not hold; or

2) The FL Property that is the right operand holds in any cycle C such that the Sequence that is the left operand holds tightly from the given cycle to C.

In one embodiment, as shown in FIG. 4A, the following actions show one example of fusion of two sequences (R1:R2) synthesized to an FSM.

In action 1, an FSM for R1 and R2 is created with {a[*];b[*]}:{c[*];d}.

In action 2, an epsilon (ε) transition is dropped from an initial state to a final state in each FSM (marked as dotted transition in FIG. 4A).

In action 3, a set of transition conditions is taken into the final state of R1 (for example, T1){a(S0-S1), b(S0-S1), b(S1-S1)}.

In action 4, a set of transitions is taken out of the initial state of S2 (for example, T2) {c(S2-S2), d(S2-S3)}

In action 5, a cross product is taken of T1 and T2 such that {a&c(S0-S2), a&d(S0-S3), b&c(S0-S2), b&d(S0-S3), b&c(S1-S2), b&d(S1-S3)}.

In action 6, these transitions from R1 to R2 are added to create a composite FSM, as shown in FIG. 5.

In one aspect, the final state set of the composite machine in FIG. 5 is same as final state set of R2 in FIG. 4B, and the initial state set of the composite machine in FIG. 5 is the same as the initial state set of R1 in FIG. 4A.

In one embodiment, range in repeat count [*m..n] may be converted to alternation. Alternation may be handled with the following expression:

S1[*m..inf]↔S1[*m];S1[*]
S1[*m..n]↔S1[*m]|S1[*m+1]|. . . |S[*n]

In one embodiment, an abort on the sub-formula may be performed such that aborts may be handled as reset on the generated FSM. In one example, when the abort condition is true, the FSM is reset to the initial state.

In one embodiment, clocking of a sub-formula may be performed such that a clocked sequence may be converted to a semantically equivalent unclocked sequence.

In one embodiment, an output FSM interface may be provided such that synthesis of a sequence S creates an FSM for the sequence S with the following interface inputs and outputs. Enable may comprise an input Boolean condition that signifies the start of a string match. If this condition is false, the FSM may not start a match. This may be referred as fsm.enable. Discharge may comprise an input Boolean condition, which when true, resets the FSM to an initial state. This may be referred as fsm.discharge. Finished may comprise a true expression whenever the FSM has recognized a string in S. This may be referred as fsm.finished. Failed may comprise a true expression whenever the recognizer has recognized a string that may not be extended to a string that reaches fsm.finished=true. In one aspect, the complement of a string has been recognized, and to generate fsm.failed, a deterministic FSM may be required.

In one embodiment, action 108 of the method 100 of FIG. 1 may provide synthesis of assertions using FSMs for sequences. In one aspect, sequence implication may be recursively defined by the following:

sequence_implication:=sequence|—>sequence
|sequence|—>(sequence_implication)

Figure 2:
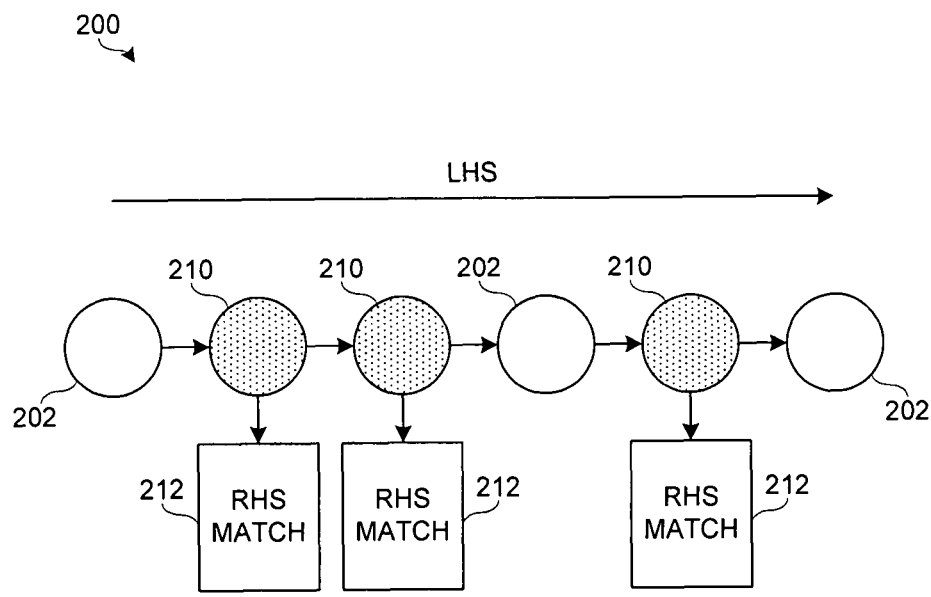
FIG. 2 shows one embodiment of semantics of sequence implication.

A PSL or SVA formula may be transformed to a sequence implication form, wherein an assertion is checked using FSMs generated by synthesis of sequences in that assertion. In one embodiment, FIG. 2 shows one embodiment of semantics of sequence implication pictorially as diagram 200. The semantics for the following formula comprise:

LHS (left-hand-side) sequence|—>RHS (right-hand-side) sequence;

In one aspect, for one or more (possibly overlapping) matches of LHS sequence, there exists a match for RHS sequence. In one embodiment, as shown in FIG. 2, circles 202 show the progress of an LHS match, a shaded circle 210 signifies that a match for an LHS sequence has finished in that evaluation cycle, and a match 212 for RHS sequence may be started. In one aspect, a match of RHS sequence may be found starting each cycle in which a match for LHS finished, as shown in FIG. 2 by many grey circles. In one aspect, for a weak form of an assertion, it may be sufficient to check that one or more of the RHS matches do not fail, and for a strong form of an assertion, it may be found that one or more of the RHS matches finish at some point in time.

Figure 3:
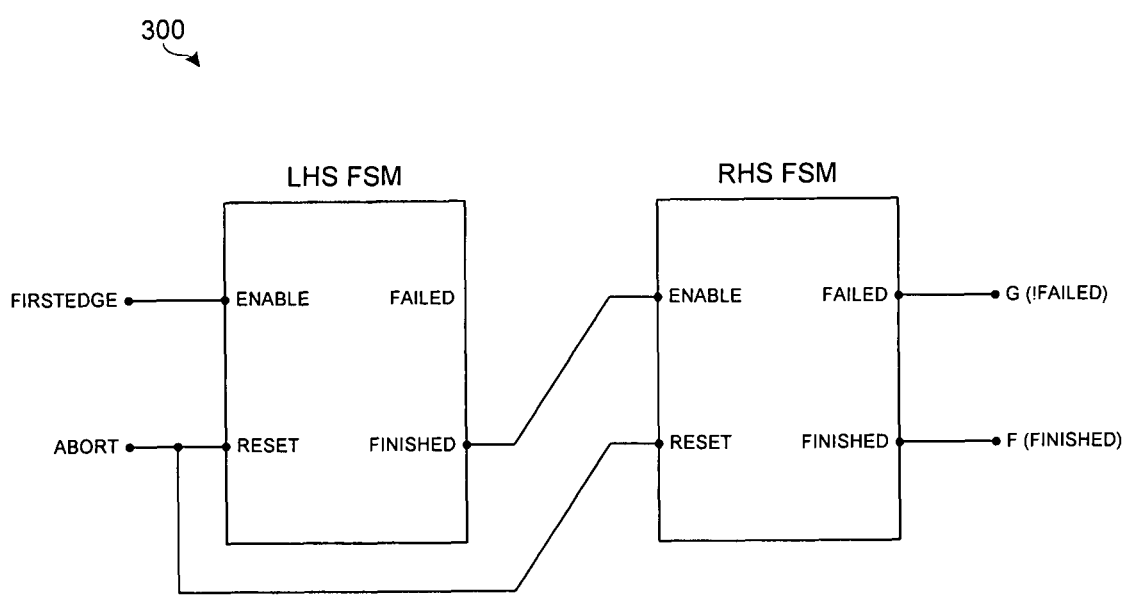
FIG. 3 shows one embodiment of FSM connectivity for checking a formula.

FIG. 3 shows one embodiment of FSM connectivity 300 for checking the above formula. In one embodiment, finished of LHS FSM acts as the enable to the RHS FSM. In one aspect, LTL formula may be checked on the outputs of RHS FSM. For a nested sequence implication formula of the form, $S_1|{\longrightarrow}S_2|{\longrightarrow}\ldots|{\longrightarrow}S_{n-1}|{\longrightarrow}S_n$ In one embodiment, the following construction may be required.

Definition: firstedge: true only at first evaluation cycle, false otherwise.

$S_1$_fsm.enable=firstedge (In one aspect, firstedge, for unclocked property is true in first cycle of verification. For clocked property this is first state in which clock edge becomes true). In one embodiment of the following section, 'G' and 'F' are LTL operators for 'always' and 'eventually':

$S_2$_fsm.enable=$S_1$_fsm.finished . . .
$S_{n-1}$_fsm.enable=$S_{n-2}$_fsm.finished
$S_n$_fsm.enable=$S_{n-1}$_fsm.finished
G(~$S_n$_fsm.failed) [for weak form]
G($S_{n-1}$_fsm.finished—>F($S_n$_fsm.finished)) [for strong form]

In one embodiment, verification of PSL and SVA may be supported using basic LTL checks on FSMs generated by sequence synthesis.

Supporting basic LTL checks in the following:

a) Formal Verification:

G check is done by checking for the condition to be true in all states.

F check is done by searching for a loop in the reachable state set such that the satisfying condition is false in each state in this loop.

b) Simulation/Emulation/Acceleration:

G check may only be falsified in this case. At every evaluation, the satisfying condition is checked to hold. If it does not hold the check fails.

F check is done as follows. After the enabling condition is true in any evaluation cycle, start checking for fulfilling condition in every subsequent evaluation till the fulfilling condition is true in some evaluation. If the fulfilling condition is not true till the end of simulation then the check fails. If fulfilling condition is met then we have obtained one witness of the check.

In one embodiment, a sequence is synthesized in the context of an enable condition enable, abort condition discharge, and clock edge condition clk. The synthesized FSM generates finished and/or failed outputs. A rule base system to optimize sequence size, failed and finished condition may be useful in practice. These rules use basic algebraic rules of expressions.

In one aspect, the format<enable, sequence, edge, discharge> represents a sequence in the context of enable condition enable, clock edge and discharge condition discharge.

Rule 1: Sequence starting in initial state:
S:<firstedge(clk), {true[*]; r1},clk,false>
S_equivalent:<true, {r1},clk,false>
Sequence "{true[*];r1}" in the above context may be replaced by "{r1}", with enable condition tied to 1.

Rule 2: Sequence of size one
S:<enable, {b1}, clk, dis>
S_fsm.finished=enable&b1&clk&!dis;
S_fsm.failed=enable&clk&!dis&!b1;
This results in a Boolean condition for finished and failed conditions.

Rule 3: Sequence to start match at every cycle
S:<firstedge(clk), {T[*]},False,clk>
S.finished=clk
The above machine generates a match at every clock edge. The sequence is optimized out in this case.

Rule 4: Regular expression Algebra
S:<enable, {S1[*];S1[*]},clk,dis>
S_equivalent:<enable, {S1[*]}, clk, dis>

Rule 5: Regular expression Algebra
S:<enable, {S1;false;S2}, clk, dis>
S_equivalent:<enable, {S1;false}, clk, dis>

For context aware sequence synthesis, a PSL or SVA formula of the form: seq1|—>seq2, checks that for one or more matches of seq1 there exists a match of seq2. In one aspect, this has all match semantics, i.e. if there are multiple parallel matches of seq1 along a path, we have to track all of them. For each match of seq1, there exists at least one match of seq2 along the same path, starting from the cycle in which match of seq1 finished, which needs to be tracked. The following example shows one embodiment of this feature.

always{a;b[*];c}|—>{c;d[*];e};

After application of rewrite rules becomes,

{true[*];a;b[*];c}|—>{d;e[*];f};

In one embodiment, to track a match of the LHS sequence {true[*];a;b[*];c}, a non-deterministic FSM may need to be created. The FSM has O(n) states which is 3 in this case (i.e. the size of sequence minus 1, wherein the last term is not remembered). This tracker may be used for an LHS sequence with tools that support non-determinism, such as formal verification. This type of FSM may be referred to as LHS_NONDET.

In one embodiment, in 130 of method 100 of FIG. 1, the final FSM provided in action 124 can be used to verify circuitry and/or design thereof. In one aspect, Assertion Based Verification (ABV) is used for final FSM verification. ABV assertions written in PSL or SVA are synthesized (or converted) to the final FSM (Finite State Machine) in action 124 for verification in action 130 with verification tools. In one aspect, the FSM is useful for an emulator (or verification tool) to implement hardware, such as electronic circuits and/or circuitry. In another aspect, the assertions may need to be synthesized to Deterministic Finite Automata (DFA) and Non-deterministic Finite Automata (NFA) for verification tools to use them.

In one embodiment, for tools that do not support non-determinism, such as emulation and simulation, the FSM created above needs to be determinized. In one aspect, determinization leads to an increase in states of the FSM to $O(2^n)$. In one example, the number of states becomes 8. This FSM may be used to track matches of LHS sequence seq1 with any verification tool including emulation and simulation. This type of FSM may be referred to as LHS_DET.

In one embodiment, for an RHS sequence, the requirement may be to find that for each LHS_fsm.finished, the RHS_sequence match does not fail. This may find the complement of the language of RHS sequence over the same alphabet. In one aspect, implementation may construct a deterministic FSM.

In one embodiment, to track an RHS sequence match corresponding to only one LHS sequence match, the enable of RHS_fsm with~RHS_fsm.begun, wherein begun signifies whether a match has already started. To track all the LHS sequence matches, an RHS_fsm non-deterministic starts by putting an unconditional self-transition on the initial state of the RHS_fsm.

In one embodiment, since this matcher is created after determinization, it has $O(2^2)$ states. In one example, it is 8 states. Since a non-deterministic self transition is in the initial state, this may only be used with tools supporting non-determinism. This type of FSM may be referred to as RHS_NONDET.

In one embodiment, for use with tools that do not support non-determinism, this matcher needs to be determinized. This may lead to a blow up of states to $O(2^{2^n})$ states. This matcher may be used for an RHS sequence with any verification tool. With the empirical data generated, one observation is that, due to the fact that non-determinism is only at the start and enable is conditioned with~fsm.begun, the final deterministic FSM has $O(2^{n^2})$ states. In one aspect, only n distinct matches could be in progress at any point in time. This matcher may be referred to as RHS_DET.

In one embodiment, table 1 below shows a summary of what type of FSM to use in various contexts. The table also shows an order of states for each implementation.

TABLE 1

|  | LHS sequence | RHS sequence |
| --- | --- | --- |
| Formal Verification | LHS_NONDET: O(n) | RHS_NONDET: $O(2^n)$ |
| Simulation | LHS_DET: $O(2^n)$ | RHS_DET: $O(2^{n^2})$ |
| Emulation/Acceleration | LHS_DET: $O(2^n)$ | RHS_DET: $O(2^{n^2})$ |

In one embodiment, for assertion versus constraint synthesis, a verification directive on a property specifies whether the property is an assertion or a constraint. In one aspect, constraints may limit the verification to only those paths on which the property holds, and constraints may be applicable only to formal verification.

In one embodiment, verification is not done on paths on which the constraint does not hold. Thus, it may be necessary that all possible parallel and overlapping matches of the constraints be always tracked during verification. In one aspect, due to this requirement non-determinism may not be used to track constraints. This may lead to usage of only deterministic FSMs for constraint implementation. Thus, the following FSMs may be used to implement constraints:

LHS sequences: Use deterministic FSM with deterministic start and parallel matches tracking in same FSM. (LHS_DET).

RHS sequences: Use fully deterministic FSM implementation. (RHS_DET).

Usage of deterministic FSMs increases the number of state-bits and hence the verification complexity for formal verification.

Moreover, it may be seen that using non-determinism for verification also reduces the size of synthesized FSM significantly. In one aspect, since the size of FSM has a direct impact on verification complexity, a reduction in size of FSM in improves verification runtimes significantly.

In one embodiment, the complexity of constraints in terms of state-bits is a problem. Little has been done to reduce the number of state-bits for the checking FSMs for constraints. Some embodiments of the invention provide ideas of simplifying the FSM for constraints using sequence breaking and sequence shifting techniques.

In one embodiment, creating a composite FSM for one or more of the constraints as opposed to individual FSM for each constraint may assist in reducing the complexity of verification. Empirical data shows that RHS_DET FSM may be implemented in $O(2^{n^2})$ states as opposed to theoretical count of $O(2^{2^n})$. In one aspect, support of SVA local variables in verification flows is another challenge that may require new ideas to be explored.

Based on context of sub-formulas, different forms of FSMs (i.e. FSM of (O(n)), $O(2^n)$ or $O(2^{2^n})$ states complexity could be used. Based on analysis of different formulas, a tighter bound for FSM of complexity $O(2^{2^n})$ may exist. An FSM of complexity $O(2^{n^2})$ is discussed herein. In some embodiments of the invention, a complete framework of PSL and SVA synthesis is provided, and different a class of opportunistic optimizations is also provided.

In one embodiment, methods may be used for synthesis of SVA and PSL assertions. The method is applicable for synthesis of assertions for model checking, simulation, emulation and acceleration. The proposed method is also applicable to new PSL IEEE 1850 standard and the IEEE 1800 standard for system Verilog assertions.

Figure 6:
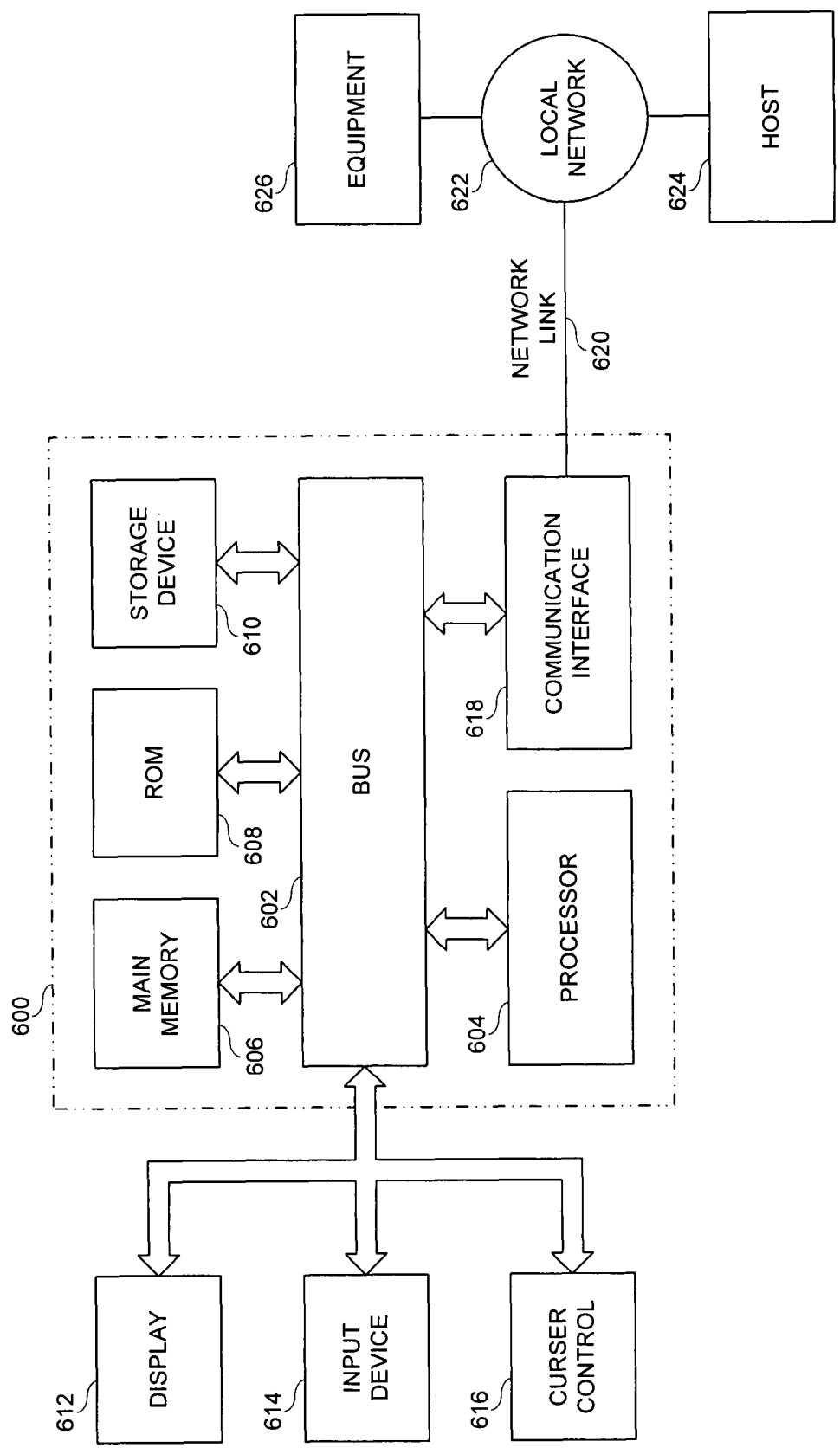
FIG. 6 shows one embodiment of a computer system with which embodiments of the invention may be implemented.

FIG. 6 shows an example of an embodiment of a block diagram of a computer system 600 that may be used to implement embodiments of the invention described herein. In particular, the computer system 600 stores and executes a computer software program for performing any of the functions or actions described herein. The computer system 600 includes a bus 602 or other communication mechanism for communicating information, and a processor 604 coupled with the bus 602 for processing information. The computer system 600 also includes a main memory 606, such as a random access memory (RAM) or other dynamic storage device, coupled to the bus 602 for storing information and instructions to be executed by the processor 604. The main memory 606 also may be used for storing temporary variables or other intermediate information during execution of instructions to be executed by the processor 604. The computer system 600 further includes a read only memory (ROM) 608 or other static storage device coupled to the bus 602 for storing static information and instructions for the processor 604. A data storage device 610, such as a magnetic disk or optical disk, is provided and coupled to the bus 602 for storing information and instructions.

The computer system 600 may be coupled via the bus 602 to a display 612, such as a cathode ray tube (CRT), for displaying information to a user. An input device 614, including alphanumeric and other keys, is coupled to the bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane.

Embodiments of the invention are related to the use of computer system 600 for implementing context aware synthesis of assertions. In one embodiment, such use is provided by computer system 600 in response to processor 604 executing one or more sequences of one or more instructions contained in the main memory 606. Such instructions may be read into the main memory 606 from another computer-readable medium, such as storage device 610. Execution of the sequences of instructions contained in the main memory 606 causes the processor 604 to perform the process actions described herein. One or more processors in a multi-processing arrangement may also be employed to execute the sequences of instructions contained in the main memory 606. In alternative embodiments, hard-wired circuitry may be used in place of or in combination with software instructions to implement some embodiments of the invention. Thus, embodiments of the invention are not limited to any specific combination of hardware circuitry and software.

The term "computer-readable medium" as used herein refers to any medium that participates in providing instructions to the processor 604 for execution. Such a medium may take many forms, including but not limited to, non-volatile media and volatile media. Non-volatile media includes, for example, optical or magnetic disks, such as the storage device 610. Volatile media includes dynamic memory, such as the main memory 606.

Common forms of computer-readable media include, for example, a floppy disk, a flexible disk, hard disk, magnetic tape, or any other magnetic medium, a CD-ROM, any other optical medium, punch cards, paper tape, any other physical medium with patterns of holes, a RAM, a PROM, an EPROM, a FLASH-EPROM, any other memory chip or cartridge, or any other medium from which a computer may read.

Various forms of computer-readable media may be involved in carrying one or more sequences of one or more instructions to the processor 604 for execution. For example, the instructions may initially be carried on a magnetic disk of a remote computer. The remote computer may load the instructions into its dynamic memory and send the instructions over a telephone line using a modem. A modem local to the computer system 600 may receive the data on the telephone line and use an infrared transmitter to convert the data to an infrared signal. An infrared detector coupled to the bus 602 may receive the data carried in the infrared signal and place the data on the bus 602. The bus 602 carries the data to the main memory 606, from which the processor 604 retrieves and executes the instructions. The instructions received by the main memory 606 may optionally be stored on the storage device 610 either before or after execution by the processor 604.

The computer system 600 also includes a communication interface 618 coupled to the bus 602. The communication interface 618 provides a two-way data communication coupling to a network link 620 that is connected to a local network 622. For example, the communication interface 618 may be an integrated services digital network (ISDN) card or a modem to provide a data communication connection to a corresponding type of telephone line. As another example, the communication interface 618 may be a local area network (LAN) card to provide a data communication connection to a compatible LAN. Wireless links may also be implemented. In any such implementation, the communication interface 618 sends and receives electrical, electromagnetic or optical signals that carry data streams representing various types of information.

The network link 620 typically provides data communication through one or more networks to other devices. For example, the network link 620 may provide a connection through local network 622 to a host computer 624 or to another equipment 626. The data streams transported over the network link 620 may comprise electrical, electromagnetic or optical signals. The signals through the various networks and the signals on the network link 620 and through the communication interface 618, which carry data to and from the computer system 600, are exemplary forms of carrier waves transporting the information. The computer system 600 may send messages and receive data, including program code, through the network(s), the network link 620, and the communication interface 618.

Although particular embodiments of the present inventions have been shown and described, it will be understood that it is not intended to limit the present inventions to the preferred embodiments, and it will be obvious to those skilled in the art that various changes and modifications may be made without departing from the spirit and scope of the present inventions. The specification and drawings are, accordingly, to be regarded in an illustrative rather than restrictive sense. The present inventions are intended to cover alternatives, modifications, and equivalents, which may be included within the spirit and scope of the present inventions as defined by the claims.

What is claimed is:

1. A computer implemented method for assertion synthesis of circuitry comprising:

using at least one computer system which comprises at least one processor and is programmed for performing:

converting an assertion formula to a sequence implication form using one or more semantic preserving rewrite rules, wherein
the sequence implication form converted by the one or more semantic preserving rewrite rules is semantically equivalent to the assertion formula;
optimizing a resulting formula, which is converted from the assertion formula, to reduce a number of states in a state machine that represents the circuitry;
synthesizing the resulting formula to the state machine using context aware sequence synthesis, wherein
the context aware sequence synthesis synthesizes the resulting formula based at least in part upon context of one or more sequences in the resulting formula; and
verifying the circuitry using the state machine.

2. The method of claim 1, wherein the assertion formula comprises a PSL (Property Specification Language) formula.

3. The method of claim 1, wherein the assertion formula comprises an SVA (System Verilog Assertions) formula.

4. The method of claim 1, wherein the state machine comprises an FSM (Finite State Machine).

5. The method of claim 1, wherein the method is applied to at least one form of Assertion Based Verification (ABV).

6. The method of claim 5, wherein the at least one form of Assertion Based Verification (ABV) includes at least one of formal verification, simulation and emulation.

7. The method of claim 1, further comprising storing information related to verifying the circuitry using the state machine.

8. The method of claim 7, wherein the information related to verifying the circuitry using the state machine is stored on a memory device.

9. A system for assertion synthesis of circuitry comprising;
at least one computer system which comprises at least one processor and is programmed for performing:
converting an assertion formula to sequence implication form using one or more rewrite rules, wherein
the sequence implication form converted by the one or more semantic preserving rewrite rules is semantically equivalent to the assertion formula;
optimizing a resulting formula, which is converted from the assertion formula, to reduce a number of states in a state machine that represents the circuitry;
synthesizing the resulting formula to the state machine using context aware sequence synthesis, wherein
the context aware sequence synthesis synthesizes the resulting formula based at least in part upon context of one or more sequences in the resulting formula; and
verifying the circuitry using the state machine.

10. The system of claim 9, wherein the assertion formula comprises a PSL (property Specification Language) formula.

11. The system of claim 9, wherein the assertion formula comprises an SVA (System Verilog Assertions) formula.

12. The system of claim 9, wherein the state machine comprises an FSM (Finite State Machine).

13. The system of claim 9, wherein the assertion synthesis is applied to at least one form of Assertion Based Verification (ABV).

14. The system of claim 13, wherein the at least one form of Assertion Based Verification (ABV) includes at least one of formal verification, simulation and emulation.

15. The system of claim 9, further comprising means for storing information related to verifying the circuitry using the state machine.

16. The system of claim 15, wherein the means for storing information comprises a memory device.

17. A computer readable storage medium storing a computer program comprising instructions which, when executed by at least one computer system, cause the computer system to perform a process for assertion synthesis of circuitry, the process comprising:
using the at least one computer system which comprises at least one processor and is programmed for performing:
converting an assertion formula to sequence implication form using one or more rewrite rules, wherein
the sequence implication form converted by the one or more semantic preserving rewrite rules is semantically equivalent to the assertion formula;
optimizing a resulting state machine to reduce a number of states in the state machine that represents the circuitry;
synthesizing a resulting formula, which is converted from the assertion formula, to the resulting state machine using context aware sequence synthesis, wherein
the context aware sequence synthesis synthesizes the resulting formula based at least in part upon context of one or more sequences in the resulting formula; and
verifying the circuitry using the state machine.

18. The computer readable medium of claim 17, wherein the assertion formula comprises a PSL (Property Specification Language) formula.

19. The computer readable medium of claim 17, wherein the assertion formula comprises an SVA (System Verilog Assertions) formula.

20. The computer readable medium of claim 17, wherein the state machine comprises an FSM (Finite State Machine).

21. The computer readable medium of claim 17, wherein the method is applied to at least one form of Assertion Based Verification (ABV).

22. The computer readable medium of claim 21, wherein the at least one form of Assertion Based Verification (ABV) includes at least one of formal verification, simulation and emulation.

23. The computer readable medium of claim 17, further comprising storing information related to verifying the circuitry using the state machine.

24. The computer readable medium of claim 23, wherein the information related to verifying the circuitry using the state machine is stored on a memory device.

* * * * *